(12) United States Patent
Bayruns

(10) Patent No.: US 10,848,106 B2
(45) Date of Patent: Nov. 24, 2020

(54) WIDE DYNAMIC RANGE AUTO-AGC TRANSIMPEDANCE AMPLIFIER

(71) Applicant: DUET MICROELECTRONICS LLC, Raritan, NJ (US)

(72) Inventor: Robert J. Bayruns, Raritan, NJ (US)

(73) Assignee: Duet Microelectronics, Inc., Raritan, NJ (US)

( * ) Notice: Subject to any disclaimer, the term of this patent is extended or adjusted under 35 U.S.C. 154(b) by 106 days.

(21) Appl. No.: 15/964,255

(22) Filed: Apr. 27, 2018

(65) Prior Publication Data

US 2019/0334482 A1 Oct. 31, 2019

(51) Int. Cl.
*H03F 1/08* (2006.01)
*H03F 3/45* (2006.01)
(Continued)

(52) U.S. Cl.
CPC ............... *H03F 1/083* (2013.01); *G01J 1/46* (2013.01); *H03F 3/45071* (2013.01); *H03G 3/3084* (2013.01); *G01J 2001/446* (2013.01); *H01L 29/205* (2013.01); *H01L 29/778* (2013.01); *H03F 2200/126* (2013.01); *H03F 2200/129* (2013.01); *H03F 2200/144* (2013.01); *H03F 2200/267* (2013.01); *H03F 2200/387* (2013.01); *H03F 2200/48* (2013.01);
(Continued)

(58) Field of Classification Search
CPC .. H03F 1/083; H03F 3/45475; H03F 3/45071; H03F 2200/63; H03F 2203/45518; H03F 2203/45526; H03F 2200/48; H03F 2200/129; H03F 2200/126; H03F 2200/144; H03F 2200/267; H03F 2200/387; H03G 3/3084; G01J 1/46; G01J 2001/446; H01L 29/778; H01L 29/205

See application file for complete search history.

(56) References Cited

U.S. PATENT DOCUMENTS 5,602,510 A   2/1997   Bayruns
5,646,573 A   7/1997   Bayruns
(Continued)

FOREIGN PATENT DOCUMENTS

EP   3404831   * 11/2018

*Primary Examiner* — Tony Ko
(74) *Attorney, Agent, or Firm* — John H. Choi & Associates

(57) ABSTRACT

An automatic gain control (AGC) transimpedance amplifier (TIA) uses a differential structure with feedback PIN diodes to adjust the loop gain of the amplifier automatically to maintain stability over a wide dynamic range when converting optical power using a photodiode to an electrical signal. A stable DC current derived from the photodiode current sets the voltage gain of the amplifier. The use of ultra-linear long carrier lifetime PIN diodes assures the transimpedance feedback resistance is linear. The AGC function adjusts the gain of the TIA to provide a linear stable differential transresistance controlled by the photodiode current; a linear stable AGC function using current supplied by the photodiode; an improvement of about 10 db of the transresistance dynamic range; and reduces the need for internal and external circuitry needed to provide the same function. The TIA is applicable to CATV optical systems which have very strict linearity requirements.

16 Claims, 8 Drawing Sheets

(51) Int. Cl.
  *G01J 1/46* (2006.01)
  *H03G 3/30* (2006.01)
  *G01J 1/44* (2006.01)
  *H01L 29/205* (2006.01)
  *H01L 29/778* (2006.01)

(52) U.S. Cl.
  CPC .............. *H03F 2200/63* (2013.01); *H03F 2203/45518* (2013.01); *H03F 2203/45526* (2013.01)

(56) References Cited

U.S. PATENT DOCUMENTS

| | | | | |
|---|---|---|---|---|
| 2008/0197271 A1* | 8/2008 | Lum | ............ | G01J 1/44 250/214 R |
| 2008/0240735 A1* | 10/2008 | Bossard | ............ | H03F 1/08 398/202 |
| 2012/0007681 A1* | 1/2012 | Welch | ............ | H03F 1/34 330/291 |

* cited by examiner

WIDE DYNAMIC RANGE AUTO-AGC TRANSIMPEDANCE AMPLIFIER

FIELD

The present disclosure relates to transimpedance amplifiers and more particularly to automatic gain-control transimpedance amplifiers for analog applications.

BACKGROUND

Fiber optic systems, such as those used in CATV systems, require optical-to-electrical receivers usually in the form of transimpedance amplifiers (TIAs). Since the optical power to the TIA can have a large dynamic range, for example, 20 db optical and 40 db electrical, this usually requires an automatic gain transimpedance amplifier for analog applications having high bandwidth, wide dynamic range, and ultra-high linearity. Devices in the prior art use a single-ended amplifier and a variable feedback resistance means connected between the input and the output of the amplifier. PIN diodes have been used, since ultra-high linearity is achieved because the dynamic resistance of a PIN diode under forward bias is substantially linearly dependent on the inverse of the current that passes through the diode.

Transimpedance amplifiers are commonly used for providing a voltage signal proportional to a current signal. TIAs are normally implemented by providing a feedback resistor across the input and output nodes of an operational amplifier. When utilized in optical communication or optical transmission systems, a transimpedance amplifier converts an input optical signal into an output voltage signal. In these applications, the optical signal, normally transmitted via optical fibers, is received by a PIN diode or an avalanche photodiode coupled to an input node of the amplifier. The photodiode converts the optical signal into a current signal which is then provided to the amplifier. Consequently, the amplifier provides, at its output terminal, a voltage signal proportional to the optical signal.

In CATV optical systems the optical power to the input of the TIA can be as high as +3 dbm (about 2 mA photocurrent) down to −20 dbm (about 10 µA photo-current). The CATV systems run analog high order QAM modulation signals and have very strict linearity requirements.

FIG. 1 illustrates a TIA circuit with a PIN diode in the prior art, such as described in U.S. Pat. No. 5,646,573 ("the '573 Patent"). In the TIA circuit of FIG. 1, a PIN diode feedback element is used to provide good linearity and a reasonable dynamic range, such as about +3 dbm to −8 dbm. The single-ended nature of the circuit in FIG. 1 results in a marginal second order distortion performance. The use of a single ended TIA in a circuit with a linear feedback PIN diode as described in the '573 Patent, has the advantage of a the constant output voltage (1:1) with optical power. The transresistance is stable over temperature. The problem with this design though is the limited practical stable operating dynamic range, such as about 10 db, and the poor second order distortion.

FIG. 2 illustrates a Maxim 3854 fixed feedback resistor differential TIA in the prior art, which uses a differential fixed feedback resistor input stage, a gain control stage and an output buffer stage. The final output signal level is kept relatively constant by use of an external op-amp automatic gain control (AGC) loop. The choice of feedback resistor is selected to provide the best overall limited performance possible using a fixed feedback resistor. The use of TIAs with fixed feedback resistors such as the one in FIG. 2 provide better second order distortion because of the balanced differential nature of the circuit. Typically, the input referred noise for a 1 Kohm feedback is about 3 pA/rtHz, the highest input power before overload is limited to about 0 dbm, and the resulting total dynamic range is limited to about 10 db (0 dbm to −10 dbm).

However, devices with external op-amp-type feedback loops are prone to threshold shift and operating temperature drift. In addition, such devices in the prior art typically require additional internal and external circuitry.

There are a number of circuits, devices, and products which reduce the open loop gain $A_{ol}$ of a TIA, such as described in U.S. Pat. No. 5,602,510, with a lower $A_{ol}$ at higher optical powers and when a feedback resistance $R_f$ is reduced. However, the prior art does not provide for ultra-linear operation.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

An improved auto-AGC TIA of the present invention uses a differential structure with two feedback PIN diodes as well as two PIN diodes used to adjust the loop gain of the amplifier automatically to maintain stability over a wide dynamic range. The present invention allows a much larger stable operating range of received optical power, with an estimated improvement in optical power range of about 10 db, which translates to 20 db of transimpedance range.

Unlike schemes in the prior art which use external op-amp-type feedback loops which are prone to threshold shift and operating temperature drift, the present invention uses the same stable DC current derived from the photodiode current to set the voltage gain of the amplifier. The use of ultra-linear long carrier lifetime PIN diodes assures the transimpedance feedback resistance is linear.

The present invention has the AGC function adjusting the gain of the TIA, since three-terminal devices such as FET and BJT's are known to be a very non-linear method of gain control. In addition, the present invention provides a linear stable differential transresistance controlled by the photodiode current; a linear stable automatic gain control function using current supplied by the photodiode; an improvement of about 10 db of the transresistance dynamic range; and a reduction in internal and external circuitry needed to provide the same function.

The use for the TIA in the present invention is applicable to CATV optical systems which have very strict linearity requirements.

In an embodiment, the present invention is a transimpedance amplifier (TIA) comprising: a gain stage having a pair of input terminals for receiving and amplifying an input signal to generate a first signal; an amplifier stage for amplifying the first signal to generate a second signal; and an output differential buffer stage having a pair of output terminals for buffering the second signal to generate an output signal at the pair of output terminals. The output differential buffer stage performs impedance matching with an output load. The gain stage includes a pseudomorphic high-electron-mobility transistor (pHEMT), which may be composed of GaAs. The amplifier stage includes a transistor for receiving the first signal at an input of the transistor. The TIA further comprises a capacitor connected between an output of the transistor and one of the pair of input terminals. The gain stage receives the input signal from a photodiode; and wherein the output differential buffer stage generates the output signal proportional to the input signal.

In another embodiment, the present invention is a circuit comprising: a photodiode for generating an optical signal from a light source; a transimpedance amplifier (TIA) having a pair of input terminals and a pair of output terminals for converting the optical signal received at the input terminals to an electrical signal output by the pair of output terminals; and a pair of feedback resistors, with each feedback resistor connected between a respective output terminal and a respective input terminal of the TIA. The feedback resistors adjust a loop gain of the TIA automatically. The feedback resistors include diodes, which may be PIN diodes. The TIA includes: a gain stage having the pair of input terminals for receiving and amplifying the optical signal to generate a first signal; an amplifier stage having the output terminals for amplifying the first signal to generate a second signal at the output terminals; and an output differential buffer stage for buffering the second signal to generate a buffered output signal. The output differential buffer stage performs impedance matching with an output load. The gain stage includes a pseudomorphic high-electron-mobility transistor (pHEMT), which may be composed of GaAs. The amplifier stage includes a transistor for receiving the first signal at an input of the transistor. The circuit further comprises a capacitor connected between an output of the transistor and one of the pair of input terminals. The gain stage receives the optical signal from the photodiode; and wherein the output differential buffer stage generates the buffered output signal proportional to the optical signal.

In an alternative embodiment, the invention is a method comprising: receiving light from a light source at a photodiode; generating an optical signal from the light using the photodiode; receiving the optical signal at a pair of input terminals of a transimpedance amplifier (TIA); converting the optical signal received at the input terminals to an electrical signal; and outputting the electrical signal by the pair of output terminals of the TIA. the method further comprises providing a pair of feedback resistors, with each feedback resistor connected between a respective output terminal and a respective input terminal of the TIA; and adjusting a loop gain of the TIA automatically using the feedback resistors.

In another alternative embodiment, the present invention includes a device comprising: a photodiode for generating an optical signal from light, wherein the optical signal has a direct current (DC) component; a resistor having a resistance and connected to the photodiode; and an amplifier having an open loop gain and connected to the resistor; wherein the DC component changes the resistance to adjust the open loop gain, thereby maintaining stability of operation of the device. The resistor may be a diode, selected from a PIN diode, a Schottky diode, and a PN-junction diode. Alternatively, the diode includes a three-terminal transistor connected to operate as a two-terminal diode, wherein the three-terminal transistor is selected from a field-effect transistor (FET), a bipolar junction transistor (BJT), and a heterojunction bipolar transistor (HBT).

BRIEF DESCRIPTION OF DRAWINGS

The foregoing summary, as well as the following detailed description of presently preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

Figure 1:
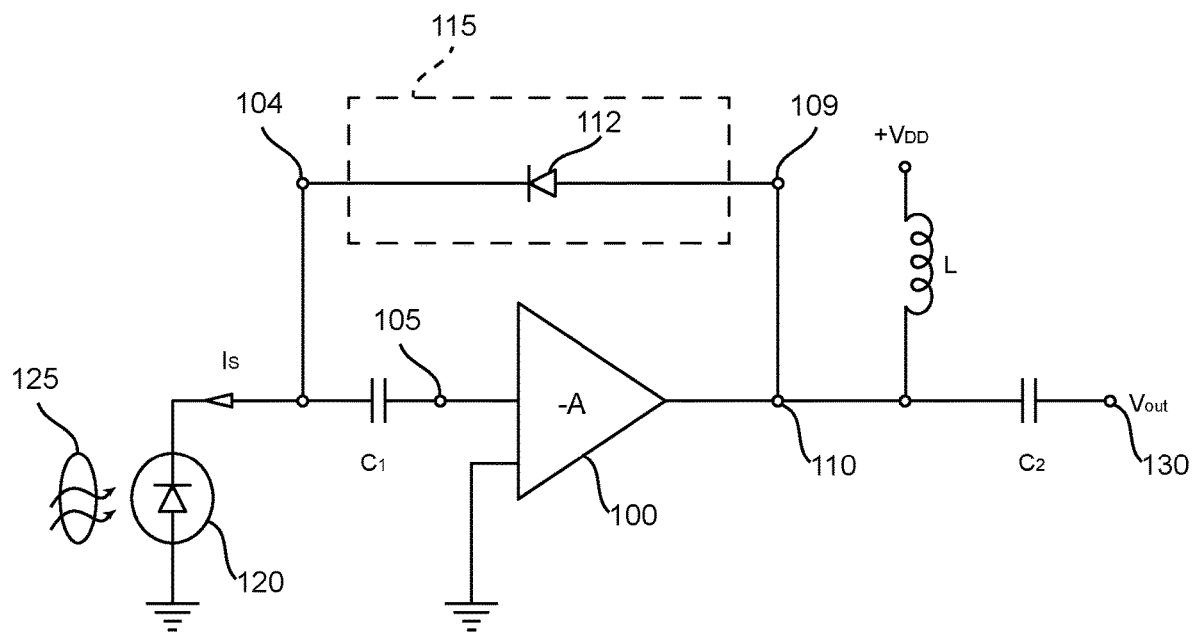
FIG. 1 illustrates a TIA circuit with a PIN diode in the prior art.
Figure 2:
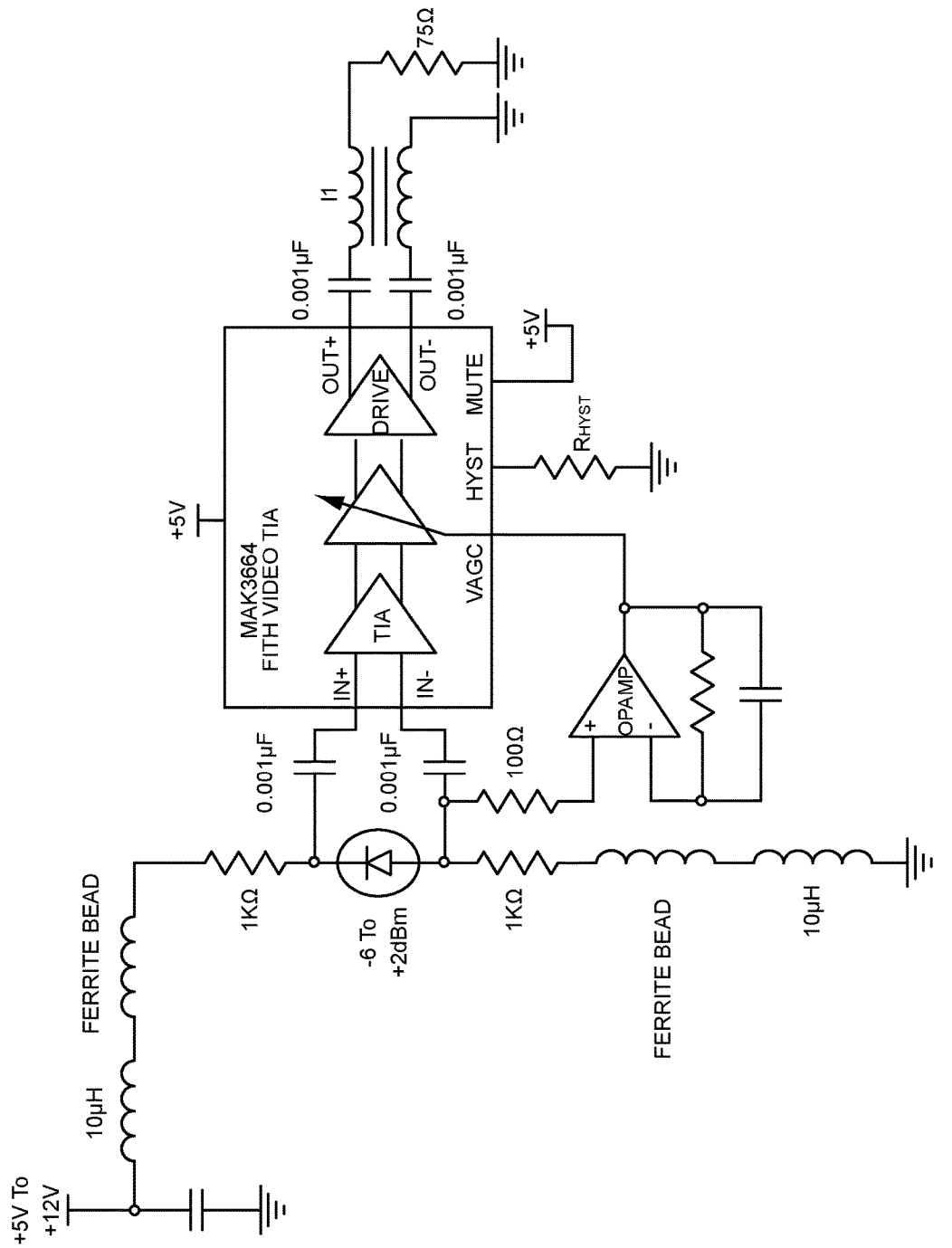
FIG. 2 illustrates a Maxim 3854 fixed feedback resistor differential TIA in the prior art.

To facilitate an understanding of the invention, identical reference numerals have been used, when appropriate, to designate the same or similar elements that are common to the figures. Further, unless stated otherwise, the features shown in the figures are not drawn to scale, but are shown for illustrative purposes only.

DETAILED DESCRIPTION

Certain terminology is used in the following description for convenience only and is not limiting. The article "a" is intended to include one or more items, and where only one item is intended the term "one" or similar language is used. Additionally, to assist in the description of the present invention, words such as top, bottom, side, upper, lower, front, rear, inner, outer, right and left may be used to describe the accompanying figures. The terminology includes the words above specifically mentioned, derivatives thereof, and words of similar import.

Figure 3:
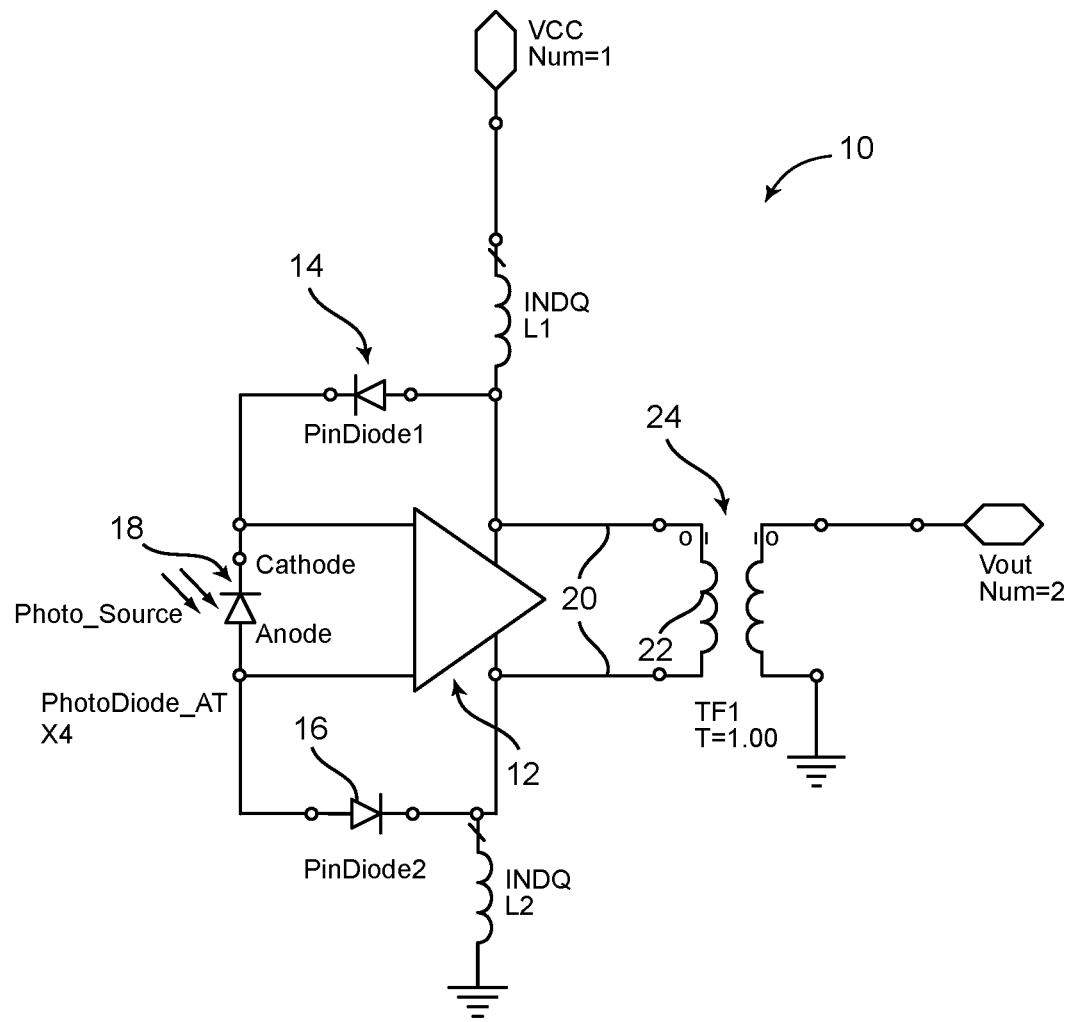
FIG. 3 illustrates a differential TIA with feedback PIN diodes of the present invention.

As shown in FIG. 3, an example circuit 10 has a differential TIA 12 of the present invention with feedback PIN diodes 14, 16 for converting an optical signal received by a photodiode 18 into an analog signal on electrical lines 20, such as an analog voltage across the lines 20. The lines 20 may be connected to an inductor 22 which may be a component of a transformer 24 for augmenting the analog signal. In an example embodiment, the TIA 12 may use a GaAs high electron mobility field-effect transistor (HFET), commercially available from GLOBAL COMMUNICATION SEMICONDUCTORS LLC (GCS), and the PIN diodes 14, 16 may be silicon PIN diodes.

This circuit 10 can provide about +3 dbm to about −12 dbm of optical dynamic range. Because the circuit 10 is differential, it can provide good second order distortion performance. Any low optical power performance is limited by stable gain and bandwidth considerations.

Figure 4:
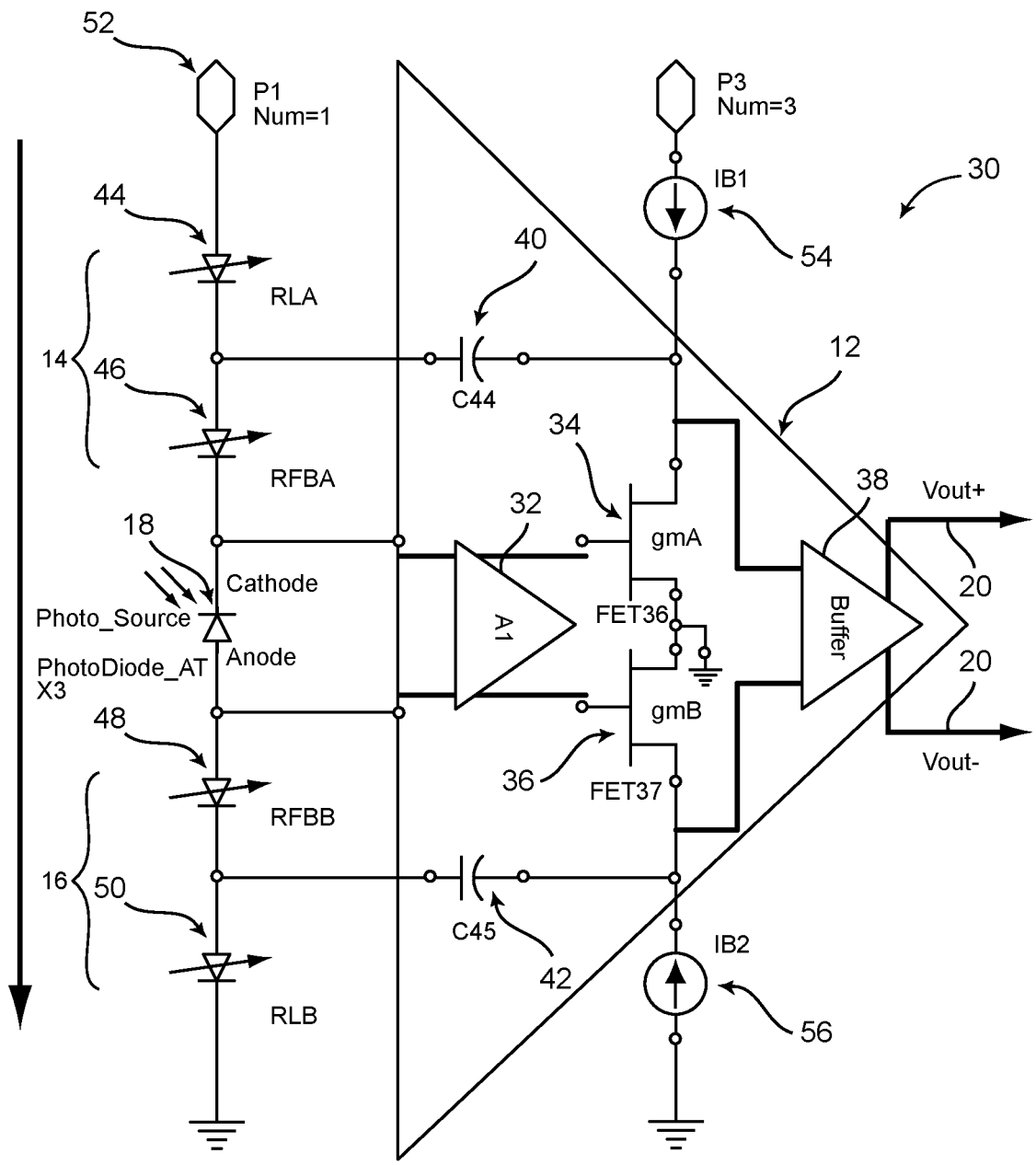
FIG. 4 illustrates a differential TIA of the present invention with PIN feedback diodes and PIN diodes sharing photocurrent for AGC stability control.

The transimpedance amplifier (TIA) of the present invention is shown in greater detail in FIG. 4, with PIN feedback diodes as well as PIN diodes sharing photocurrent for AGC stability control. The circuit 30 includes the differential TIA 12 having output lines 20, and internally includes an amplifier 32 connected to transistors 34, 36, which in turn are connected to a buffer 38. The transistors 34, 36 may optionally be connected to blocking capacitors 40, 42, respectively. Variable resistors 44-50 are connected in series to the photodiode 18, and have resistances RLA, RFBA, RFBB, and RLB, respectively. One or more of the variable resistors 44-50 may be or may include diodes.

The circuit 30 of FIG. 4 offers an inventive solution for optical-to-electrical operations with wide-bandwidth, low-noise, high stability, and a wide dynamic range. The circuit 30 has three gain stages: an output differential buffer stage using the buffer 38; an input amplifier stage using the transistors 34, 36; and a gain stage using the amplifier 32. The output differential buffer stage is used to provide a good output impedance match to an output load, such as the inductor 22 or the transformer 24 in FIG. 3, which is virtually independent of the value of the feedback resistance $R_f$. The amplifier 32 of the gain stage includes a GaAs pHEMT transistor which is low noise and high input impedance. The voltage gain of the amplifier 32 in this stage is denoted by the label A1, and has the value $A_1$. In this embodiment the feedback elements formed by the resistors 46, 48, and having resistance values RFBA and RFBB, respectively, are connected to the output drains of the transistors 34, 36, having transconductances labeled $gm_A$ and $gm_B$, respectively. Capacitors 40, 42 are included at the output drains of the transistors 34, 36, respectively, and are meant to be large and essentially an AC short over the frequencies of use.

As shown in FIG. 4, the circuit 30 of the present invention has PIN diodes as linear variable resistors 44-50. A DC bias voltage at pin 52, labeled P1, is provided to the PIN photodiode 18, labeled X3. A major aspect of the circuit 30 of the present invention is that the same photodiode current flows through all of the devices 18 and 44-50, and not to the input of the first stage 32 due to its high input impedance. DC blocking capacitors 40, 42 could be added at the drains of the transistors 34, 36, respectively, which may be BJT input transistors. The current sources 54, 56, labeled IB1, IB2, respectively, provide the bias currents for the transistors 34, 36, respectively.

Referring to FIG. 4, the operation of the circuit 30 is as follows: an optical power signal is applied to photodiode 18. The current produced by the photodiode 18 will be $I_{X3}=P_{opt} \times R$ where $P_{opt}$ is the optical power, and R is the responsivity of the photodiode 18. For 1310 nm and 1550 nm photodiodes, R is close to unity. The DC value of $I_{X3}$ will flow through all four PIN diodes 44-50, causing a value of equivalent feedback resistance $R_f$ proportional to the current for PIN diodes 44-50. The output differential voltage $V_{out}$, assuming $A_{ol}$ is high and RFBA=RFBB, will be:

$$V_{out}=2(I_{X3} \times RFA) \times (BUFFER) \quad (1)$$

where BUFFER is a factor associated with the buffer 38. For $gm_A=gm_B$, $$A_{ol}=2A_1 gm_A RLA \quad (2)$$

where $A_{ol}$ is the open loop gain, and $A_1$ is the gain of the amplifier 32.

Because the capacitors 40, 42 are an AC short, the resistor 44 appears to be directly as the load resistor element for the second gain stage of the TIA 12. At high optical powers, all of the PIN diode resistors 44-50 have resistances of small values and offer high bandwidth and low distortion since $V_{out}$ will follow the above equations.

In fact, since the feedback resistance $R_f$ for the PIN diodes 44-50 changes one-to-one (1:1) with DC current, $V_{out}$ will remain constant, hence removing the need for an external AGC loop in the circuit 30. As the $P_{opt}$ is reduced, all of the resistances of the PIN diode resistors 44-50 will increase in value, offering a high $A_{ol}$ and low noise.

Referring to FIGS. 3-4, the devices and circuits shown therein use a DC component of the optical signal from the photodiode 18 changes the resistance to adjust the open loop gain of the amplifiers 12, 32, thereby maintaining stability of operation of the device or circuit. The photodiode 18 generates an optical signal from light from a light source, and the optical signal has a direct current (DC) component. At least one resistor or other component has a resistance and is connected to the photodiode 18. Each amplifier 12, 32 in FIGS. 3-4, respectively, has an open loop gain and is connected to the resistor, so that the DC component changes the resistance to adjust the open loop gain, thereby maintaining stability of operation of the device or circuit. The resistor may be a diode such as one or more of the diodes 14, 16 in FIG. 3, and the diodes 44-50 in FIG. 4. Each diode may be a PIN diode, a Schottky diode, and a PN-junction diode. Alternatively, the diode may be a three-terminal transistor connected to operate as a two-terminal diode in a manner known in the art. The three-terminal transistor may be a field-effect transistor (FET), a bipolar junction transistor (BJT), and a heterojunction bipolar transistor (HBT).

Figure 5:
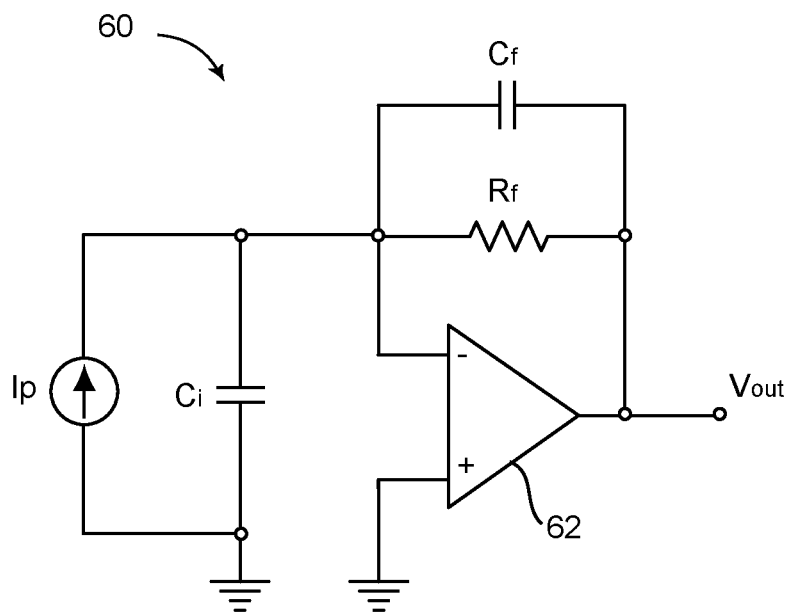
FIG. 5 illustrates a single-ended equivalent circuit used to describe stability in the TIA of the present invention.

FIG. 5 illustrates a single-ended equivalent circuit 60 used to describe stability in the TIA 12 of the present invention. In FIG. 5, the amplifier 62 is connected in parallel with the elements $R_f$ and $C_f$, with $R_f$ being the feedback resistance, and $C_f$ being the feedback capacitance, while the input capacitance is $C_i$ which is parallel to a current source $I_p$ representing the input optical power signal. Referring to the simplified single-ended TIA circuit 60 of FIG. 5, one can show the trade-offs between transimpedance bandwidth and noise:

$$Z_{in}=R_f/((1+sC_f R_f)(1+A_{ol})) \quad (3)$$

$$C_i=C_{photodiode}+C_{amplifier} \quad (4)$$

$$f_{3\,db}=1/(2\pi Z_{in} C_i) \quad (5)$$

then a bigger open loop gain $A_{ol}$ gives a higher $f_{3\,db}$, and then a bigger $R_f$ which gives a lower $f_{3\,db}$. In addition, $$I^2=4KT\Delta f/R_f \quad (6)$$

then a bigger $R_f$ results in lower noise.

From the above Equations (3)-(6), one can see the tradeoff between noise and bandwidth. In order to achieve the best bandwidth and the best circuit performance with the lowest noise as possible, circuits require a TIA with a very large feedback resistance $R_f$ and a very large amplifier open loop gain $A_{ol}$.

Another tradeoff which arises with wide dynamic systems is stability at high optical powers. With an optical power as high as +3 dbm the typical PIN diode would offer an $R_f$ of about 100 ohms. This would cause a lot of feedback from the input to the output. If there is an input frequency $f_i$ in the amplifier 62 in FIG. 5, where the total phase shift is 360° before $A_{ol}$ reaches unity, the circuit 60 will become unstable and oscillate. The equations for beta, the feedback factor, and $f_{zf}$ are given below:

$$\beta = \frac{1+R_f C_f s}{1+R_f(C_i+C_f)s} \quad (5)$$

and

-continued $$f_{d} = \frac{1}{2\pi R_f (C_i + C_f)} \quad (6)$$

Figure 6:
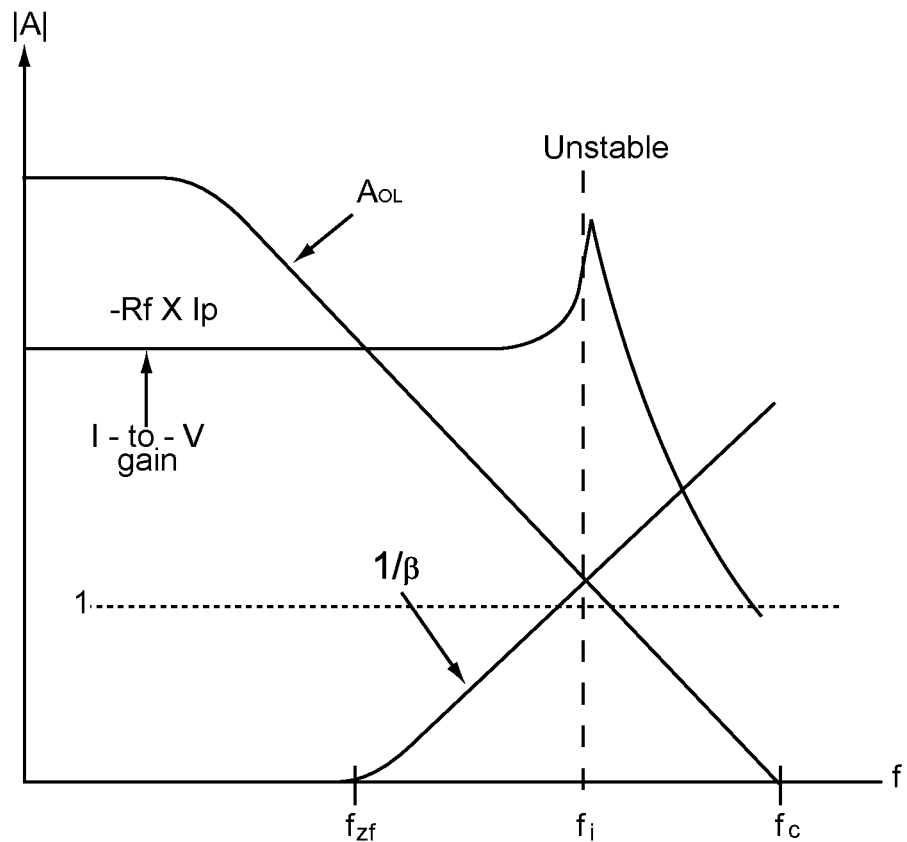
FIG. 6 illustrates Bode plots used to describe stability in the TIA of the present invention.

FIG. 6 illustrates Bode plots used to describe stability in the TIA of the present invention. As shown in FIG. 6, the current-to-voltage gain of the TIA, measured as a function of $-R_f \times I_p$, is very linear over a wide range of frequencies, until around the input frequency $f_i$ at which the operation of the TIA would become unstable.

Figure 7A:
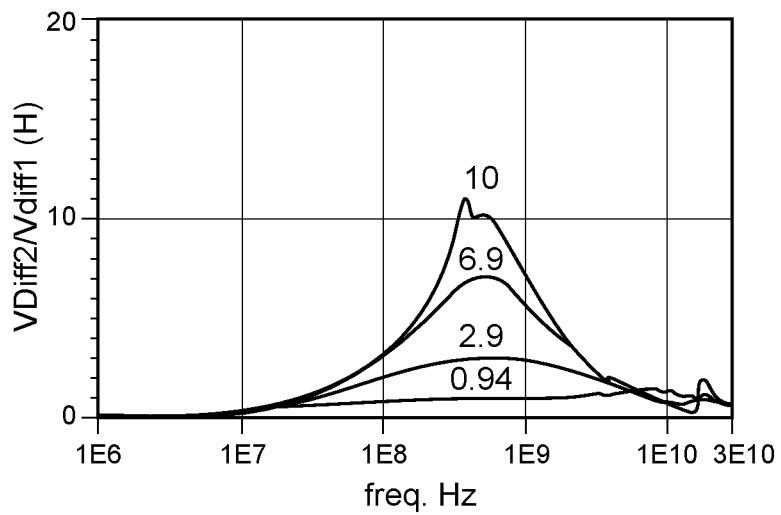
FIGS. 7A-7B illustrate voltage gains of the present invention.
Figure 7B:
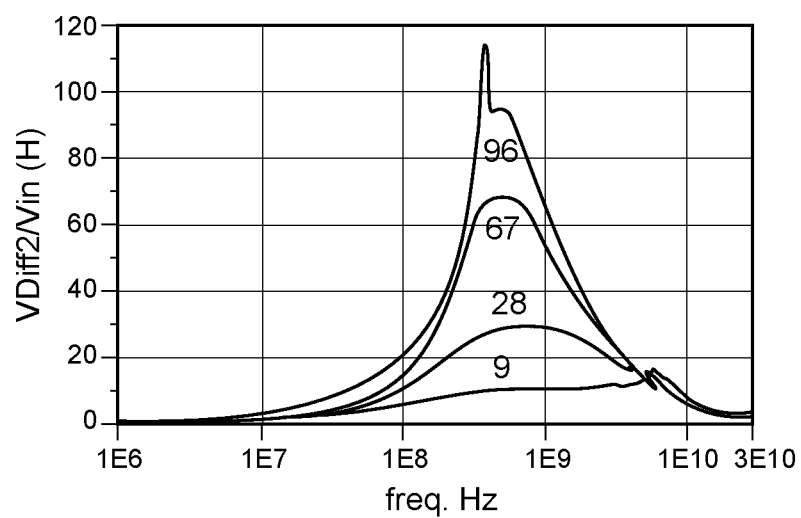

FIGS. 7A-7B illustrate voltage gains of the present invention. FIG. 7A measures voltage gains for the second stage in FIG. 4 using photocurrents $I_{X3}$ of 2 mA, 500 µA, 100 µA and 10 µA, in which the voltage gain is measured by the product $A_1 gm_4 RLA$. For the photocurrents $I_{X3}$ of 2 mA, 500 µA, 100 µA and 10 µA, the gain $gm_4 RLA$ is 0.94, 2.9, 7 and 10 in the mid-band response, respectively. FIG. 7B measures the total voltage gain using photocurrents $I_{X3}$ of 2 mA, 500 µA, 100 µA and 10 µA. For the measure of stability in the transresistance response, a peaking of about 3 db is the highest allowable in a circuit.

Figure 8:
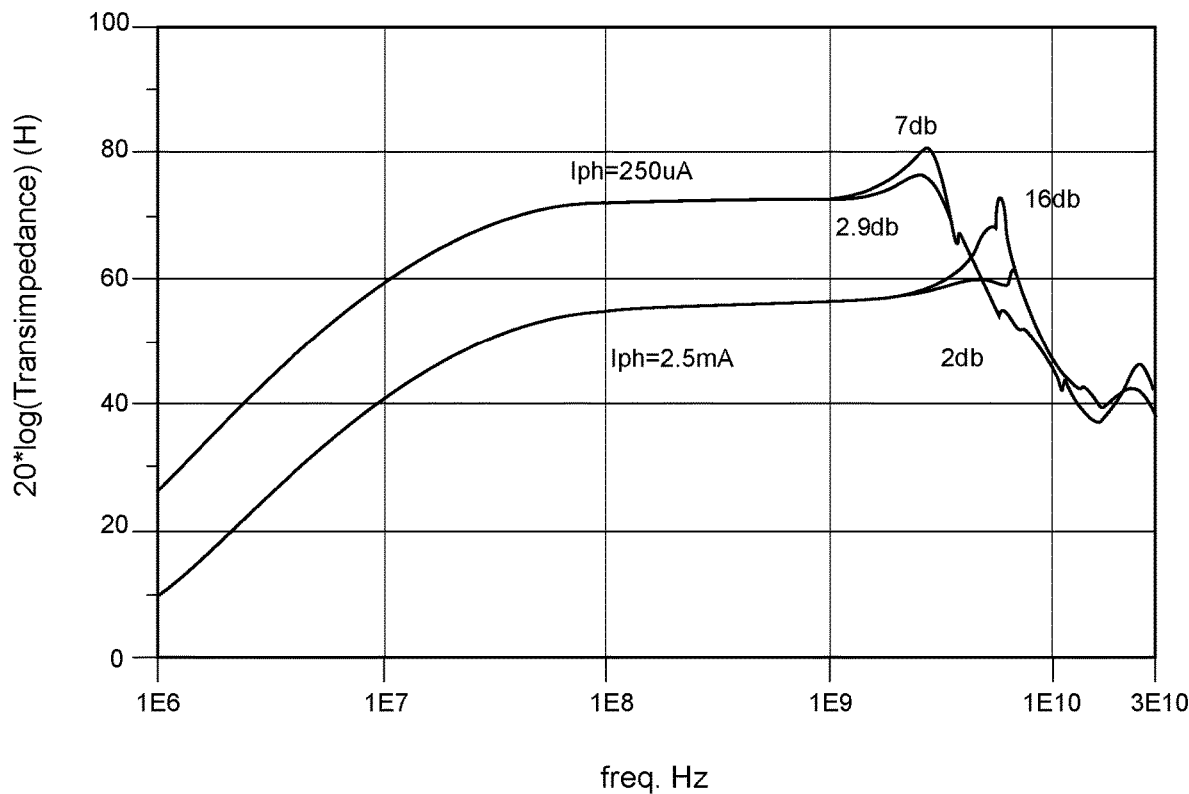
FIG. 8 illustrates the performance of a TIA circuit 30 with and without PIN diode AGC resistors.

FIG. 8 illustrates the performance of the TIA circuit 30 with and without PIN diode AGC resistors 44, 50 in FIG. 4. At a photocurrent $I_{X3}$ of 250 µA, labeled $I_{ph}$ in FIG. 8, the circuit 30 without the resistors 44, 50 shows 7 db of peaking while the circuit 30 with the resistors 44, 50 is at 2.9 db. At higher $I_{X3}$ of 2.5 mA, labeled $I_{ph}$ in FIG. 8, the circuit 30 without the resistors 44, 50 shows less peaking of about 2 db, while the other circuit with the resistors 44, 50 shows 16 db of peaking. Such results represent a 10 times or 20 db transresistance improvement in performance.

The circuit of FIG. 6 can be modified using two extra PIN diode resistors connected to the first gain stage via DC block capacitors to further improve performance. In addition, a number, N, of gain stages using this technique may be used, with N being greater than one.

The present invention may be embodied in other specific forms without departing from its spirit or essential characteristics. The described embodiments are to be considered in all respects only as illustrative and not restrictive. The scope of the invention, therefore, will be indicated by claims rather than by the foregoing description. All changes, which come within the meaning and range of equivalency of the claims, are to be embraced within their scope.

What is claimed is:

1. A circuit comprising:
   a photodiode for generating an optical signal from a light source;
   a transimpedance amplifier (TIA) having a pair of input terminals and a pair of output terminals for converting the optical signal received at the input terminals to an electrical signal output by the pair of output terminals, the TIA including:
      a gain stage having the pair of input terminals for receiving and amplifying the optical signal to generate a first signal;
      an amplifier stage having:
         the output terminals for amplifying the first signal to generate a second signal at the output terminals; and
         a transistor for receiving the first signal at an input of the transistor; and
      an output differential buffer stage for buffering the second signal to generate a buffered output signal; and
      a pair of feedback resistors, with each feedback resistor connected between a respective output terminal and a respective input terminal of the TIA.

2. The circuit of claim 1, wherein the feedback resistors adjust a loop gain of the TIA automatically.

3. The circuit of claim 1, wherein the feedback resistors include diodes.

4. The circuit of claim 3, wherein the diodes are PIN diodes.

5. The circuit of claim 1, wherein the output differential buffer stage performs impedance matching with an output load.

6. The circuit of claim 1, wherein the gain stage includes a pseudomorphic high-electron-mobility transistor (pHEMT).

7. The circuit of claim 6, wherein the pHEMT is composed of GaAs.

8. The circuit of claim 1, further comprising:
   a capacitor connected between an output of the transistor and one of the pair of input terminals.

9. The circuit of claim 1, wherein the gain stage receives the optical signal from the photodiode; and
   wherein the output differential buffer stage generates the buffered output signal proportional to the optical signal.

10. A method comprising:
    receiving light from a light source at a photodiode;
    generating an optical signal from the light using the photodiode;
    receiving the optical signal at a pair of input terminals of a transimpedance amplifier (TIA), wherein the TIA includes:
       a gain stage having the pair of input terminals for receiving and amplifying the optical signal to generate a first signal;
       an amplifier stage having:
          the output terminals for amplifying the first signal to generate a second signal at the output terminals; and
          a transistor for receiving the first signal at an input of the transistor; and
       an output differential buffer stage for buffering the second signal to generate a buffered output signal;
    providing a pair of feedback resistors, with each feedback resistor connected between a respective output terminal and a respective input terminal of the TIA;
    converting the optical signal received at the input terminals to an electrical signal; and
    outputting the electrical signal by the pair of output terminals of the TIA.

11. The method of claim 10, further comprising:
    providing a pair of feedback resistors, with each feedback resistor connected between a respective output terminal and a respective input terminal of the TIA; and
    adjusting a loop gain of the TIA automatically using the feedback resistors.

12. A device comprising:
    a photodiode for generating an optical signal from light, wherein the optical signal has a direct current (DC) component;
    a first resistor having a resistance and connected to the photodiode;
    an amplifier having an open loop gain and connected to the first resistor, wherein the amplifier includes:
       a gain stage having the pair of input terminals for receiving and amplifying the optical signal to generate a first signal;
       an amplifier stage having:

the output terminals for amplifying the first signal to generate a second signal at the output terminals; and a transistor for receiving the first signal at an input of the transistor; and an output differential buffer stage for buffering the second signal to generate a buffered output signal; and a pair of feedback resistors, with each feedback resistor connected between a respective output terminal and a respective input terminal of the amplifier;

wherein the DC component changes the resistance to adjust the open loop gain, thereby maintaining stability of operation of the device.

13. The device of claim 12, wherein the resistor is a diode.

14. The device of claim 13, wherein the diode is selected from a PIN diode, a Schottky diode, and a PN-junction diode.

15. The device of claim 13, wherein the diode includes a three-terminal transistor connected to operate as a two-terminal diode.

16. The device of claim 15, wherein the three-terminal transistor is selected from a field-effect transistor (FET), a bipolar junction transistor (BJT), and a heterojunction bipolar transistor (HBT).

* * * * *